US006956897B1

(12) United States Patent
Honig

(10) Patent No.: US 6,956,897 B1
(45) Date of Patent: Oct. 18, 2005

(54) REDUCED RANK ADAPTIVE FILTER

(75) Inventor: Michael L. Honig, Evanston, IL (US)

(73) Assignee: Northwestern University, Evanston, IL (US)

( * ) Notice: Subject to any disclaimer, the term of this patent is extended or adjusted under 35 U.S.C. 154(b) by 558 days.

(21) Appl. No.: 09/670,673

(22) Filed: Sep. 27, 2000

(51) Int. Cl.$^7$ ............................ H03H 7/30; H04B 1/10; H04B 1/69
(52) U.S. Cl. ..................... 375/232; 375/350; 375/148; 375/149
(58) Field of Search ............................. 375/232, 144, 375/149, 350, 148; 370/342, 335; 704/226

(56) References Cited

U.S. PATENT DOCUMENTS

| | | | | | |
|---|---|---|---|---|---|
| 5,724,270 | A | * | 3/1998 | Posch | 702/77 |
| 5,806,025 | A | * | 9/1998 | Vis et al. | 704/226 |
| 5,963,899 | A | * | 10/1999 | Bayya et al. | 704/226 |
| 6,501,747 | B1 | * | 12/2002 | Friedlander et al. | 370/342 |

OTHER PUBLICATIONS

Michael Honig and Michail K. Tsatsanis, Adaptive Techniques for Multiuser CDMA Receivers, May. 2000, Signal Processing Magazine, IEEE , vol.: 17 Issue: 3, pp. 49-61.*
Model selection through a statistical analysis of the global minimum of a weighted non-linear least squares cost function Pintelon, R.; Schoukens, J.; Vandersteen, G.; Decision and Control, 1996. ☐☐Page(s): 3100-3106.*
Reduced-rank adaptive filtering Goldstein, J.S.; Reed, I.S.; Signal Processing, IEEE Transactions on [see also Acoustics, Speech, and Signal Processing, IEEE Transactions on] , vol.: 45 Issue: 2 , Feb. 1997 Page(s): 492-496.*
Continuously adaptive linear predictive coding of speech Bellegarda, J.R.; Farden, D.C.; Acoustics, Speech, and Signal Processing, 1988. ICASSP-88., 1988 International Conference on , Apr. 11-14, 1988, Page(s): 347-350 vol. 1.*
Michael Honig and Michail K. Tsatsanis, Adaptive Techniques for Multiuser CDMA Receivers, May 2000, Signal Processing Magazine, IEEE , vol.: 17 Issue: 3, pp. 49-61.*
Adaptive reduced-rank residual correlation algorithms for DS-CDMA interference suppression;Honig, M.L. et al.: Signals, Systems & Computers, 1998. Conference Record of the Thirty-Second Asilomar Conference on , vol.: 2 , Nov. 1-4, 1998; p. 1106-1110 vol. 2.*

* cited by examiner

Primary Examiner—Stephen Chin
Assistant Examiner—Cicely Ware
(74) Attorney, Agent, or Firm—McAndrews, Held & Malloy, Ltd.

(57) ABSTRACT

A reduced rank adaptive digital filtering method is described for a received signal consisting of a sequence of N×1 received vectors. Each received vector is formed from a group of N successive samples. D+1 basis vectors are generated where D is less than N and the dimension of a desired reduced rank subspace. Each successive basis vector is generated by multiplying an immediate preceding basis vector by the covariance matrix for the sequence of received sample vectors and the first basis vector is formed from a given or estimated steering vector. D filter coefficients are generated from correlations between pairs of basis vectors. The adaptive digital filter of the present invention achieves near optimal rank performance with substantially fewer training symbols than heretofore possible.

25 Claims, 4 Drawing Sheets ced RANK ADAPTIVE FILTER

STATEMENT REGARDING FEDERALLY SPONSORED RESEARCH OR DEVELOPMENT

This invention was supported at least in part by funding from the Federal Agency ARO under Grant No. DAAD 19-99-1-0288 and Grant No. DAAHOY-96-L0378.

CROSS-REFERENCE TO RELATED APPLICATIONS

N/A

FIELD OF THE INVENTION

The present invention is directed to a method of adaptive digital filtering and more particularly to such a method utilizing a reduced rank technique.

BACKGROUND OF THE INVENTION

Adaptive digital filters are known for use in various signal processing applications including speech and radar processing, adaptive beamforming, echo cancellation and equalization. These filters estimate the optimal filter coefficients from observed data, i.e. data representing the received signal to be processed.

Reduced rank filters estimate the filter coefficients with a relatively small amount of observed data. Various reduced rank techniques are known including Principal Components, Cross-Spectral and Partial Despreading methods. The former two methods require an explicit estimate of the signal subspace via an eigen-decomposition of the input covariance matrix which is extremely complex. Although the latter technique is much simpler, it does not achieve near full rank performance when the filter rank D is significantly less than the full rank N.

Other known reduced rank techniques include a multistage Wiener filter as proposed by Goldstein et al. in "A Multistage Representation Of The Wiener Filter Based On Orthogonal Projections" IEEE Trans. Inform. Theory, 44 (7), November, 1998 and an adaptive interference suppression algorithm as proposed by Honig et al. in "Adaptive Reduced-Rank Residual Correlation Algorithms For DS-CDMA Interference Suppression" In Proc. 32 Asilomar Conf. Signals, Syst. Comput., November, 1998. These methods perform well and do not require an eigen-decomposition. The present invention is an improvement of these latter two methods.

BRIEF SUMMARY OF THE INVENTION

In accordance with the present invention, the disadvantages of prior adaptive digital filters noted above have been overcome. The reduced rank adaptive filter of the present invention projects a received signal onto a lower dimensional subspace where the reduced rank subspace is iteratively constructed by multiplying the last basis vector by the received sample covariance matrix. The reduced rank filter of the present invention achieves full rank performance with a projected signal subspace having a significantly smaller dimension than the dimension of the received signal subspace. Moreover, for interference suppression applications, the optimum filter rank does not substantially increase with the dimension of the received signal subspace. As such, the method of the present invention enables faster tracking and convergence with significantly less training samples than can be achieved with prior techniques.

More particularly, the method of the present invention filters successive, received signal samples to provide a desired signal wherein a group of N successive samples form a received sample vector of digital data having a N×1 dimension. The method includes generating D+1 basis vectors where D is less than N and represents the reduced rank dimension. Each successive basis vector is generated from a given or an estimated steering vector and successively greater powers of a covariance matrix for a sequence of received sample vectors of data. The first basis vector is formed from the steering vector. A reduced rank vector of digital data having a D×1 dimension is generated from a matrix of D basis vectors and the received sample vector of data. D filter coefficients are generated from correlations between pairs of the basis vectors. The desired signal output from the filter is generated from the filter coefficients and the reduced rank vector of data.

The method of the present invention can be used in any adaptive filtering application including echo and noise cancellation, channel equalization, radar processing, adaptive antenna arrays and interference suppression. The method of the present invention is particularly advantageous for applications where long filter lengths are required and fast convergence and tracking are important. One such application is for space-time interference suppression in wireless Code-Division Multiple Access (CDMA) systems.

These and other advantages and novel features of the present invention, as well as details of an illustrated embodiment thereof, will be more fully understood from the following description and drawings.

DETAILED DESCRIPTION OF THE INVENTION

Figure 1:
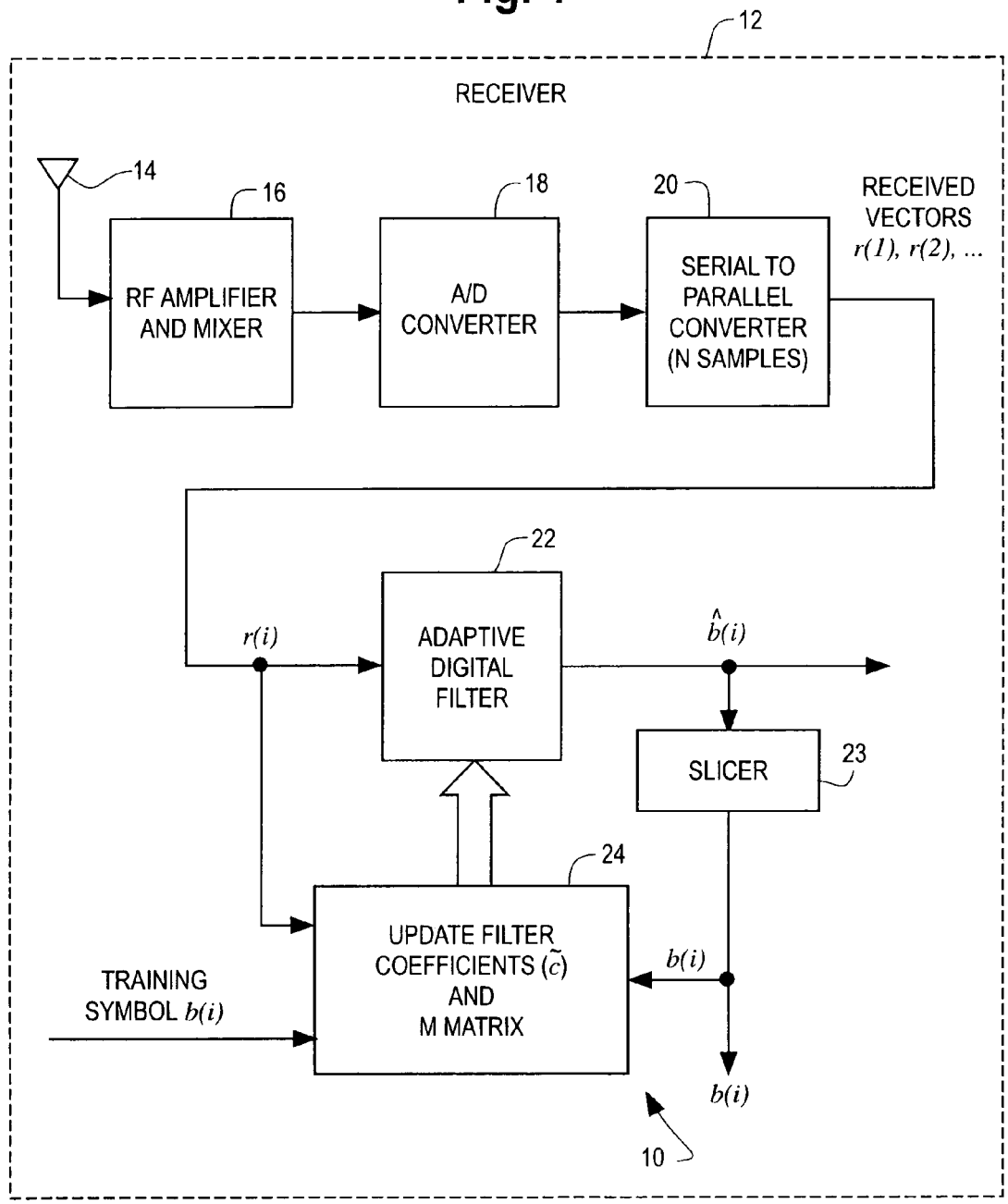
FIG. 1 is a block diagram of the reduced rank adaptive filter of the present invention for a wireless CDMA communication system.

The reduced rank adaptive digital filtering technique 10 of the present invention is illustrated in FIG. 1 for interference suppression in a wireless CDMA communication system having a receiver 12. Although illustrated for a wireless communication system, the filtering technique of the present invention can be used in any adaptive digital filter application. The receiver 12 picks up a received signal via an antenna 14 coupled to a radio frequency (RF) amplifier and mixer 16. The output of the amplifier/mixer 16 is coupled to an analog to digital converter 18 to provide a serial stream of baseband digital data samples representing the received signal. The output of the digital to analog converter 18 is coupled to a serial to parallel converter 20. The serial to parallel converter 20 takes N serial samples and outputs the N samples in parallel to provide a received sample vector r(i) of digital data having a dimension of N×1.

The received sample vector r(i), which is referred to as an observation signal, is coupled to an adaptive digital filter 22, the output of which is an estimate of the desired signal b(i), referred to as the approximate desired signal $\tilde{b}(i)$. A generator 24 produces a matrix M of basis vectors with a N×D dimension where D is less than N and represents the reduced rank dimension. The generator 24 also produces a vector of filter coefficients $\tilde{c}$ of dimension D×1 from a sequence received sample vectors r(i) for i=1, . . . , B and from a sequence of the decision derived desired signals b(i), i=1, . . . , B or a sequence of given desired signals or training symbols b(i), i=1, . . . , B. The given training symbols b(i) initially used by the generator 24 may be stored, for example, in a receiver memory (not shown).

The adaptive filter 22 generates a reduced rank or projected received signal vector $\tilde{r}(i)$ of dimension D×1 by multiplying the Hermitian transpose of the matrix M by the received sample vector r(i) as follows $$\tilde{r}(i) = M^\dagger r(i).$$

The adaptive filter 22 generates the approximate desired signal $\tilde{b}(i)$ by multiplying the Hermitian transpose of the filter coefficient vector by the reduced rank vector as follows $$\tilde{b}(i) = \tilde{c}^\dagger \tilde{r}(i).$$

The approximate desired signal $\tilde{b}(i)$ is applied to a conventional slicer 23 that essentially rounds the approximate desired signal $\tilde{b}(i)$ to a desired signal level b(i) which may be used to generate the filter coefficients in a decision directed training mode.

Figure 4:
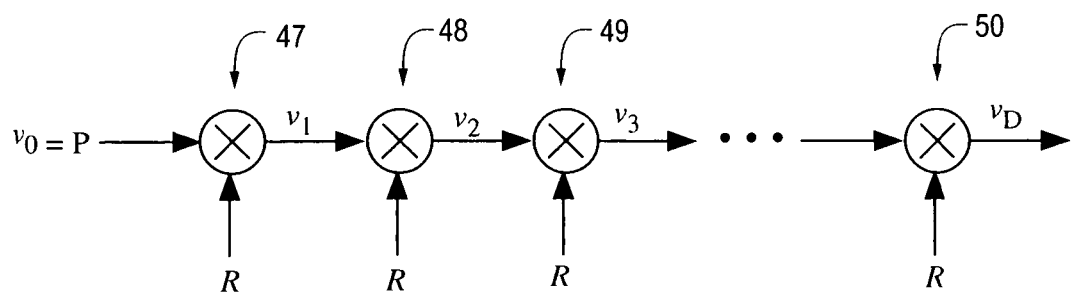
FIG. 4 is a diagram illustrating the generation of the basis vectors.

The generator 24 generates D+1 basis vectors where each successive basis vector is generated from a given or an estimated steering vector p and successively greater powers of a sample covariance matrix R for a sequence of B received sample vectors r(i), i=1 B. The first basis vector is formed from the steering vector p as described in detail below with reference to FIG. 4. The generator 24 generates a D×1 vector of filter coefficients $\tilde{c}$ from a matrix and vector of correlations between pairs of generated basis vectors.

Figure 2:
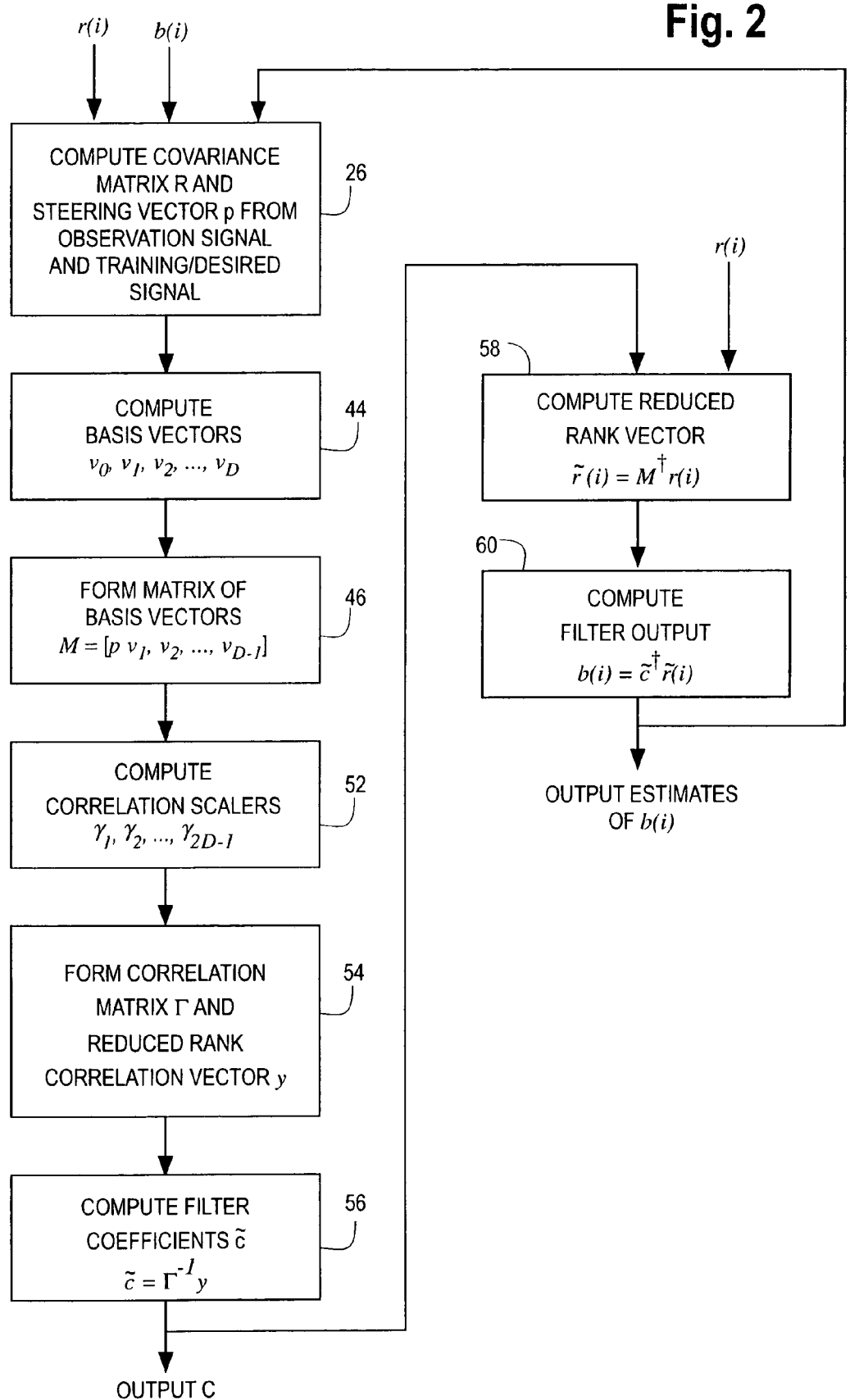
FIG. 2 is a flow chart illustrating the steps of the reduced rank adaptive digital filtering technique of FIG. 1.
Figure 3:
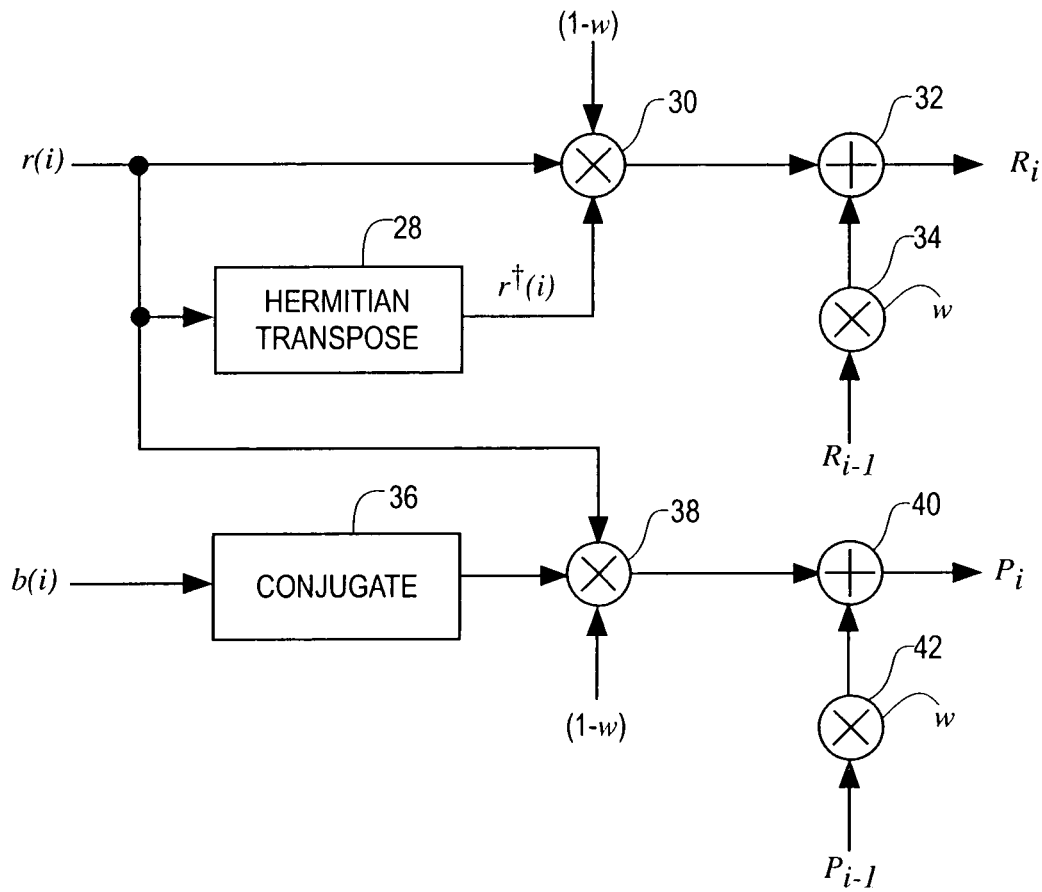
FIG. 3 is a block diagram illustrating the generation of the received signal sample covariance matrix and steering vector.

The generator 24 and adaptive digital filter 22 operate in accordance with the method depicted in FIG. 2. At block 26, the generator 24 determines the sample covariance matrix R for the sequence of received sample vectors r(i), i=1, . . . , B and the steering vector p from the sequence of received sample vectors r(i), i=1, . . . , B, and the sequence of training/desired signals b(i), i=1, . . . . B in accordance with the block diagram of FIG. 3. Specifically, at block 28, the Hermitian transpose of the received sample vector is formed and at 30 is multiplied by the received sample vector and a weighting factor of 1−w. The resulting product is added at 32 to the product formed at 34 by multiplying the weighting factor w by the previous covariance matrix $R_{i-1}$ so as to form the sample covariance matrix $R_i$ for the sequence of received sample vectors r(1), . . . , r(i). At 36, the conjugate of the given or desired signal b(i) is formed and at 38 is multiplied by the received sample vector r(i) and the weighting factor 1−w. The resulting product is added at 40 to the product of the previous steering vector $p_{i-1}$ and the weighting factor w to form the new steering vector $p_i$. The steering vector $p_i$ generated from the sequence of given training symbols b(i), i=1, . . . , B or from the sequence of desired filter outputs b(i), i=1, . . . , B as shown in FIG. 3 is an example of an "estimated" steering vector. It should be appreciated that FIG. 3 is only one example of a technique for generating the estimated steering vector. Other known techniques for generating an estimated steering vector can be used as well. A "given" steering vector can be used in accordance with the present invention as well. A "given" steering vector is a steering vector that is already known to the receiver and may be stored, for example, in a memory or buffer of the receiver.

At block 44, the generator 24 generates D+1 basis vectors $v_0$ through $v_D$. The basis vectors are generated in accordance with the diagram depicted in FIG. 4. The first or initial basis vector $v_0$ is set equal to the steering vector p. Each successive basis vector is formed by multiplying the immediately preceding basis vector by the covariance matrix R so that the basis vectors are generated as follows.

$$v_0 = p,\ v_1 = Rp,\ v_2 = R^2 p,\ \ldots,\ v_{D-1} = R^{D-1} p,\ v_D = R^D p$$

The generator 24 at block 46 forms the matrix M of basis vectors from the basis vectors $v_0$ through $v_{D-1}$ so that the matrix M has a N×D dimension. Thereafter, the generator 24 determines the correlation scalars $\gamma_1$ through $\gamma_{2D-1}$ from the basis vectors $v_0$ through $v_D$ determined at block 44. The correlation scalar $\gamma_{i+j}$ is generated by multiplying the Hermitian transpose of the basis vector $v_i$ by the basis vector $v_j$ as follows.

$$\gamma_1 = v_0^\dagger v_1,\ \gamma_2 = v_0^\dagger v_2\ \cdots\ \gamma_D = v_0^\dagger v_D,\ \gamma_{D+1} = v_D^\dagger v_1,$$
$$\gamma_{D+2} = v_D^\dagger v_2 \cdots \gamma_{2D-1} = v_D^\dagger v_{D-1}$$

Also $\gamma_0 = v_0^\dagger v_0$ and $v_0$ is assumed to be normalized to that $\gamma_0 = 1$.

The generator 24 at block 54 forms a correlation matrix $\Gamma$ from the correlation scalars $\gamma_1$, through $\gamma_{2D-1}$ as follows.

$$\Gamma = \begin{bmatrix} \gamma_1 & \gamma_2 & \cdots & \gamma_D \\ \gamma_2 & \gamma_3 & \cdots & \gamma_{D+1} \\ \vdots & & & \vdots \\ \gamma_D & \gamma_{D+1} & \cdots & \gamma_{2D-1} \end{bmatrix}$$

At block 54 the generator 24 also generates a reduced rank correlation vector y which is a D×1 vector formed of the correlation scalars $\gamma_0$ through $\gamma_{D-1}$ as follows.

$$y = \begin{bmatrix} \gamma_D \\ \gamma_1 \\ \vdots \\ \gamma_{D-1} \end{bmatrix}$$

The generator 24 at block 56 then generates the filter coefficient vector $\tilde{c}$ which is a D×1 vector generated by solving the following set of linear equations.

$$\Gamma \tilde{c} = y$$

The matrix M of basis vectors formed at block 46 and the filter coefficients $\tilde{c}$ generated at block 56 are applied to the adaptive digital filter 22 so as to generate the reduced rank vector $\tilde{r}(i)$ and the approximate desired signal $\tilde{b}(i)$ output from the filter 22 in accordance with blocks 58 and 60. In particular, at block 58, the adaptive digital filter 22 generates the reduced rank vector $\tilde{r}(i)$ by multiplying the Hermitian transpose of the matrix M of basis vectors by the received sample vector of digital data r(i) as follows.

$$\tilde{r}(i) = M^\dagger r(i)$$

At block 60, the filter 22 generates the approximate desired signal $\tilde{b}(i)$ by multiplying the Hermitian transpose of the D×1 filter coefficient vector $\tilde{c}$ by the reduced rank vector $\tilde{r}(i)$ as follows.

$$\tilde{b}(i) = \tilde{c}^\dagger \tilde{r}(i)$$

Figure 5:
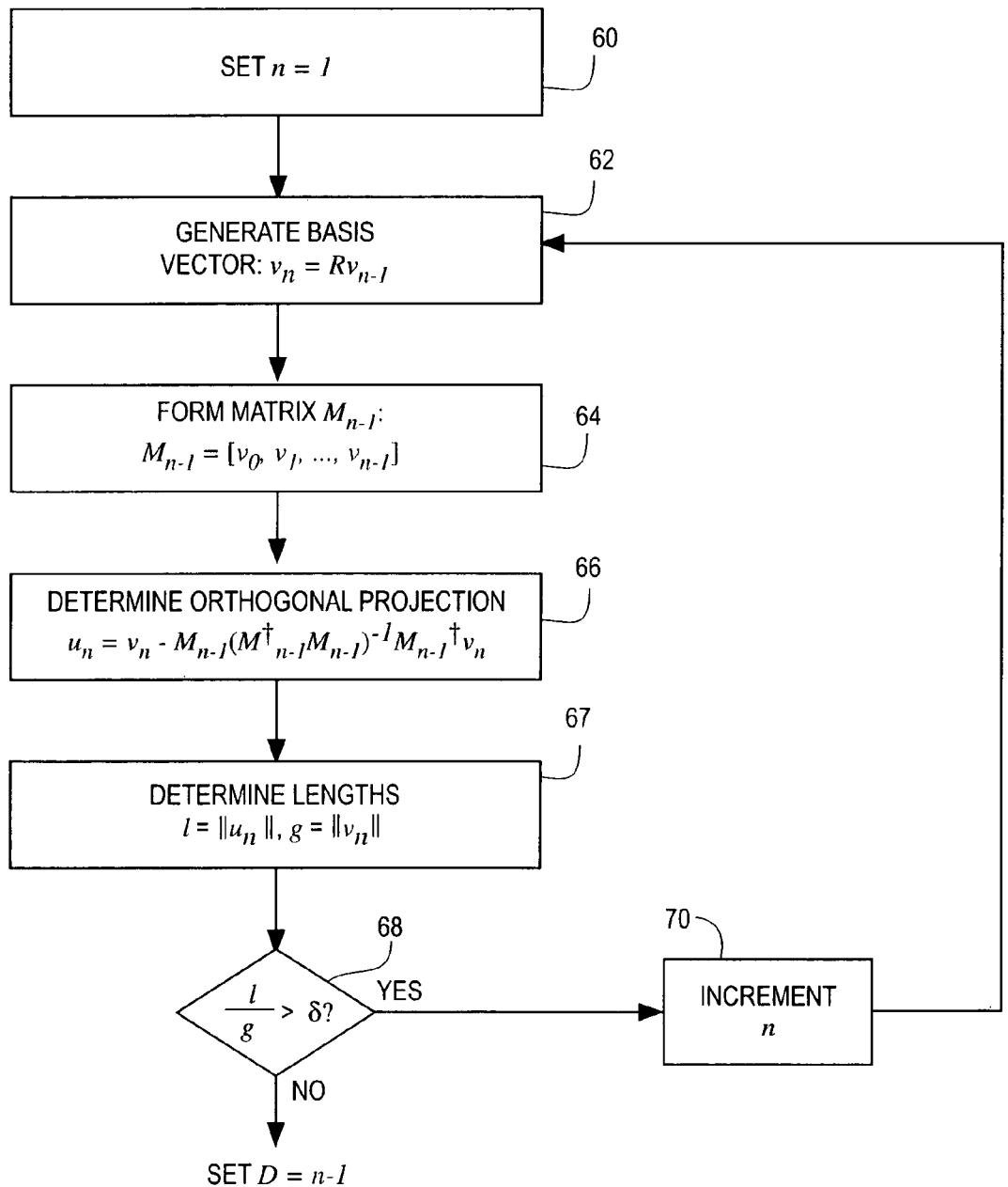
FIG. 5 is a flow chart illustrating the method of selecting the dimension of the reduced rank filter.

It has been found that the reduced rank adaptive digital filter described above achieves near full rank performance with a value of D equal to 8 or less for a Direct Sequence (DS) Code Division Multiple Access (CDMA) communication system. For other applications, the value of D can be determined in accordance with the method depicted in FIG. 5. As shown in FIG. 5, at block 60 an index n is initialized to 1. Thereafter, at block 62 the $n^{th}$ basis vector $v_n$ is generated by multiplying the previous basis vector $v_{n-1}$ by the covariance matrix R where the first basis vector is the steering vector p so that $$v_n = R^n p$$

as discussed above. Thereafter, a matrix $M_{n-1}$ of basis vectors is formed at block 64 as follows.

$$M_{n-1} = [v_0, v_1, \ldots v_{n-1}]$$

At block 66, the orthogonal projection $u_n$, which is a N×1 vector, is generated as follows.

$$u_n = v_n - M_{n-1}(M^\dagger_{n-1} M_{n-1})^{-1} M_{n-1}^\dagger v_n$$

The respective lengths l and g of the vectors $u_n$ and $v_n$ are computed at block 67 in accordance with the following equations.

$$l = \|u_n\|$$

$$g = \|v_n\|$$

where l and g are scalars. Thereafter, at block 68, it is determined whether the length l divided by the length g is greater than a small constant δ, where δ may be set equal to 0.01 for example. If so, n is incremented by 1 and steps 62 through 68 are repeated. Steps 62 through 70 are repeated until l divided by g is not greater than δ for a given value of n. At that point, D is set equal to n−1.

In an alternative method, the value of D is chosen to minimize the "a posteriori Least Squares cost function C" where $$C = \sum_{m=m_0}^{i} |b(m) - \tilde{c}_D^\dagger \tilde{r}(m)|^2$$

where $\tilde{c}_D$ is the reduced rank filter coefficient vector generated from the sequence of b(1), . . . b(B) and the sequence of r(1), . . . r(B) and $B < m_o$.

The reduced rank adaptive filter of the present invention projects the N×1 received signal vector r(i) onto the lower dimensional subspace which results in a D×1 vector $\tilde{r}(i)$ where D can be much less than N while still allowing the filter 10 to achieve near full rank performance. For interference suppression applications, the optimum filter rank D does not substantially increase with the dimension of the signal subspace N. This enables much faster tracking and convergence than can be achieved with prior techniques. Furthermore, the method of the present invention does not rely on an estimate of the signal space via, for example, eigen-decomposition so that the complexity of the present method is substantially reduced. Although the method was described in detail for a wireless communication system application, it can be used in any adaptive filtering application including, echo and noise cancellation, channel equalization, radar processing, adaptive antennae arrays, interference suppression, etc.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A method of filtering successive received signal samples, a group of N successive samples forming a received sample vector of digital data having a N×1 dimension to provide an approximate desired signal comprising:
   generating a set of basis vectors where each successive basis vector is a function of a given or an estimated steering vector and successively greater powers of a covariance matrix for a sequence of received sample vectors of data with the initial basis vector being formed from the steering vector;
   generating a reduced rank vector of digital data having a D×1 dimension, where D is less than N, from a matrix of D basis vectors and a received sample vector of data;
   generating a D×1 filter coefficient vector from the generated basis vectors; and
   generating the approximate desired signal from the filter coefficients and the reduced rank vector of data.

2. A method of filtering successive received signal samples as recited in claim 1 where D+1 successive basis vectors are generated by multiplying an immediately preceding basis vector of data by the covariance matrix for the received sample vector.

3. A method of filtering successive received signal samples as recited in claim 1 wherein the reduced rank vector is generated by multiplying a Hermitian transpose of the matrix of basis vectors by the received sample vector of data.

4. A method of filtering successive received signal samples as recited in claim 1 including forming a D×1 correlation vector with correlation scalars, each correlation scaler $\gamma_i$ formed by multiplying a Hermitian transpose of the initial basis vector by the $i^{th}$ basis vector for i equal 0 through D−1.

5. A method of filtering successive received signal samples as recited in claim 4 including forming a D×D correlation matrix Γ from 2D−1 correlation scalars generated from pairs of the basis vectors and generating a D×1 vector of filter coefficients $\tilde{c}$ by solving a set of linear equations defined by $\Gamma \tilde{c} = y$ where y is the correlation vector.

6. A method of filtering successive received signal samples as recited in claim 1 including generating the desired signal by multiplying a Hermitian transpose of the filter coefficient matrix by the reduced rank vector of data.

7. A method of filtering successive received signal samples, a group of N successive samples forming a received sample vector of digital data having a N×1 dimension to provide an approximate desired signal comprising:
   determining a received sample covariance matrix from a sequence of received sample vectors of digital data;
   determining a steering vector of data;
   generating a reduced rank vector of digital data having a D×1 dimension where D is less than N from the received sample vector of data and a matrix of D basis vectors of data wherein each successive basis vector of data is generated by multiplying an immediately preceding basis vector of data by the covariance matrix and the initial basis vector is formed from the steering vector of data;

generating D filter coefficients from a plurality of correlations between pairs of basis vectors of data; and generating the approximate desired signal from the filter coefficients and the reduced rank vector of data.

8. A method of filtering successive received signal samples as recited in claim 7 wherein the reduced rank vector is generated by multiplying a Hermitian transpose of the matrix of basis vectors by the received sample vector of data.

9. A method of filtering successive received signal samples as recited in claim 7 including forming a D×1 correlation vector with correlation scalars, each correlation scaler $\gamma_i$ formed by multiplying a Hermitian transpose of the initial basis vector by the $i^{th}$ basis vector for i equal 0 through D−1.

10. A method of filtering successive received signal samples as recited in claim 9 including forming a D×D correlation matrix $\Gamma$ from 2D−1 correlation scalars generated from pairs of the basis vectors and generating a D×1 vector of filter coefficients $\tilde{c}$ by solving a set of linear equations defined by $\Gamma\tilde{c}=y$ where y is the correlation vector.

11. A method of filtering successive received signal samples as recited in claim 7 including generating the desired signal by multiplying a Hermitian transpose of the filter coefficient matrix by the reduced rank vector of data.

12. A method of filtering successive received signal samples, a group of N successive samples forming a received sample vector of digital data having a N×1 dimension to provide an approximate desired signal comprising:

generating D+1 basis vectors wherein D is less than N and each successive basis vector is a function of a given or an estimated steering vector and successively greater powers of a covariance matrix for a sequence of the received sample vectors of data with the first basis vector being formed from the steering vector;

generating a reduced rank vector of digital data having a D×1 dimension from a matrix of D basis vectors and a received sample vector of data;

generating 2 D−1 correlations between pairs of basis vectors;

generating D filter coefficients from a matrix of said correlations and a vector of D correlations; and generating the approximate desired signal from the filter coefficients and the reduced rank vector of data.

13. A method of filtering successive received signal samples as recited in claim 12 where D+1 successive basis vectors are generated by multiplying an immediately preceding basis vector of data by the covariance matrix for the received sample vector.

14. A method of filtering successive received signal samples as recited in claim 12 wherein the reduced rank vector is generated by multiplying a Hermitian transpose of the matrix of basis vectors by the received sample vector of data.

15. A method of filtering successive received signal samples as recited in claim 12 including forming a D×1 correlation vector with correlation scalars, each correlation scaler $\gamma_i$ formed by multiplying a Hermitian transpose of the initial basis vector by the $i^{th}$ basis vector for i equal 0 through D−1.

16. A method of filtering successive received signal samples as recited in claim 15 including forming a D×D correlation matrix $\Gamma$ from 2D−1 correlation scalars generated from pairs of the basis vectors and generating a D×1 vector of filter coefficients $\tilde{c}$ by solving a set of linear equations defined by $\Gamma\tilde{c}=y$ where y is the correlation vector.

17. A method of filtering successive received signal samples as recited in claim 12 including generating the desired signal by multiplying a Hermitian transpose of the filter coefficient matrix by the reduced rank vector of data.

18. A method of filtering successive received signal samples, a group of N successive samples forming a received sample vector of digital data having a N×1 dimension to provide an approximate desired signal comprising:

selecting a dimension D for a reduced rank vector onto which a received sample vector of data is projected, where D is less than N;

generating a set of basis vectors wherein each successive basis vector is a function of a given or an estimated steering vector and successively greater powers of a covariance matrix for a sequence of received sample vectors of data with the first basis vector being formed from the steering vector;

generating a reduced rank vector of digital data having a D×1 dimension from a matrix of D basis vectors and the received sample vector of data;

generating D filter coefficients from the generated basis vectors; and generating the approximate desired signal from the filter coefficients and the reduced rank vector of data.

19. A method of filtering successive received signal samples as recited in claim 18 where D is selected to be less than or equal to 8.

20. A method of filtering successive received signal samples as recited in claim 18 where D is selected to minimize an a posteriori Least Squares cost function.

21. A method of filtering successive received signal samples as recited in claim 20 where D+1 successive basis vectors are generated by multiplying an immediately preceding basis vector of data by the covariance matrix for the received sample vector.

22. A method of filtering successive received signal samples as recited in claim 20 wherein the reduced rank vector is generated by multiplying a Hermitian transpose of the matrix of basis vectors by the received sample vector of data.

23. A method of filtering successive received signal samples as recited in claim 20 including forming a D×1 correlation vector with correlation scalars, each correlation scaler $\gamma_i$ formed by multiplying a Hermitian transpose of the initial basis vector by the $i^{th}$ basis vector for i equal 0 through D−1.

24. A method of filtering successive received signal samples as recited in claim 23 including forming a D×D correlation matrix $\Gamma$ from 2D−1 correlation scalars generated from pairs of the basis vectors and generating a D×1 vector of filter coefficients $\tilde{c}$ by solving a set of linear equations defined by $\Gamma\tilde{c}=y$ where y is the correlation vector.

25. A method of filtering successive received signal samples as recited in claim 20 including generating the desired signal by multiplying a Hermitian transpose of the filter coefficient matrix by the reduced rank vector of data.

* * * * *